United States Patent [19]

Hamano

[11] Patent Number: 4,471,371
[45] Date of Patent: Sep. 11, 1984

[54] THIN FILM IMAGE PICKUP ELEMENT

[75] Inventor: Toshihisa Hamano, Kanagawa, Japan

[73] Assignee: Fuji Xerox Co., Ltd., Tokyo, Japan

[21] Appl. No.: 336,991

[22] Filed: Jan. 4, 1982

[30] Foreign Application Priority Data

Jan. 6, 1981 [JP] Japan ............ 56-162
Jan. 12, 1981 [JP] Japan ............ 56-2111

[51] Int. Cl.³ .................................. H01L 27/14
[52] U.S. Cl. .................................. 357/31; 357/2; 357/15; 357/30
[58] Field of Search ............ 357/31, 2, 30, 15, 30 C, 357/30 H, 30 D

[56] References Cited

U.S. PATENT DOCUMENTS 4,266,333   5/1981   Reichert ............ 357/15 X
4,354,104  10/1982   Chikamura et al. ... 357/31 X
4,363,963  12/1982   Ando ............... 357/30 X

FOREIGN PATENT DOCUMENTS 0037244  10/1981   European Pat. Off. ......... 357/30 H Primary Examiner—Martin H. Edlow
Assistant Examiner—W. Mintel
Attorney, Agent, or Firm—Sughrue, Mion, Zinn, Macpeak and Seas

[57] ABSTRACT

A thin film image pickup element which consists of a photoelectric converter including a transparent electrode, a semiconductor layer, an opaque electrode and first insulator layer, and a switching element including first and second upper electrodes, another semiconductor layer, a gate electrode and a passivation film covered on the gate electrode. A two-dimensional thin film image pickup device consists of a plurality of such thin film image pickup elements by stereoscopically laminating a plurality of photoelectric converters and switching elements with the back surface used as wiring region. The device can read two-dimensional original documents without using a reducing optical system.

21 Claims, 18 Drawing Figures

THIN FILM IMAGE PICKUP ELEMENT

BACKGROUND OF THE INVENTION

This invention relates to an image pickup element for a photoelectric converter used for a facsimile and, more particularly, to a thin film image pickup element or two-dimensional thin film image pickup element used for facsimile.

A charge coupled device (CCD), a metal oxide semiconductor (MOS) or other type of thin film sensor has hertofore been used as a solid image pickup element. There exists no thin film sensor which is stereoscopically constructed with a photoelectric converting unit and switching unit. Recently, thin film sensors have been used in which an amorphous semiconductor is superposed as a photoelectric converting element on the upper surface of a MOSFET with a mono crystalline silicon wafer. However, this conventional solid image pickup element cannot be fabricated to have a size larger than the monocrystalline silicon wafer, nor can it be formed in a multilayer at the switching unit due to the properties of the monocrystalline silicon wafer.

Since the conventional one-dimensional thin film sensor is so constructed that its sensor, switching transistor and wiring pattern are all formed on the same plane, it is disadvantageous in that it requires a substrate much larger than the area of the sensor and cannot be formed in a two-dimensional shape due to structural reasons.

Further, a CCD or the like has heretofore been employed as a two-dimensional image pickup device. The two-dimensional image pickup device is fabricated by superimposing an amorphous semiconductor on the upper surface of a MOSFET in a monocrystalline silicon wafer. Since this image pickup device, however, necessitates a reducing optical system, it is disadvantageous in that its structure becomes complicated and it is therefore difficult to fabricate in a large area, thus making it difficult to read a two-dimensional original document.

There also exists a type of conventional one-dimensional image pickup device in which a driver is fabricated by a silicon IC chip and another type in which a thin film transistor, which will be hereinafter referred to as a "TFT", is formed laterally. However, the first type in which a drive is fabricated by a silicon IC chip requires a large number of bonding portions between the wiring pattern and the IC chips, and is therefore impractical. The other type in which a thin film transistor is laterally formed is constructed so that its optical converting element and a switching element are formed on the same plane, and therefore has difficulty in reading a two-dimensional original document.

SUMMARY OF THE INVENTION

Accordingly, a primary object of this invention is to provide a thin film image pickup element which eliminates the aforementioned disadvantages of conventional pickups by improving the structure of the conventional thin film image pickup element, and which can pick up an image in size corresponding to an original document at a ratio of 1:1.

Another object of this invention is to provide a thin film image pickup element of small size which can read a two-dimensional original document.

Yet another object of this invention is to provide a thin film image pickup element having a remarkably improved operating efficiency.

A further object of this invention is to provide a two-dimensional thin film image pickup device which eliminates the aforementioned drawbacks of conventional devices by improving the structure of the two-dimensional thin film image pickup element, and which can read a large-area and two-dimensional original document without using a reducing optical system.

Still another object of this invention is to provide a two-dimensional thin film image pickup device which does not adversely effect the conductivity of the semiconductor forming a current channel therein.

Still another object of the invention is to provide a two-dimensional thin film image pickup device which can be employed instead of photosensitive materials presently used for an electrophotographic machine and the like.

In order to achieve the above described objects and other objects, there is disclosed in one aspect of this invention a thin film image pickup element in which a photoelectric converting unit is formed on a substrate formed of glass or ceramics, and a switching unit is formed in thin film thereon or a wiring unit is formed in a multilayer shape so as to reduce the size.

There is also disclosed in another aspect of this invention a two-dimensional thin film image pickup device in which an image pickup element is fabricated by stereoscopically laminating a photoelectric converting element and a switching element, and the back surface of the image pickup element is used as a wiring region so as to reduce the size, and the image pickup elements are arrayed laterally and longitudinally in a matrix shape.

DESCRIPTION OF THE PREFERRED EMBODIMENTS

Figure 1:
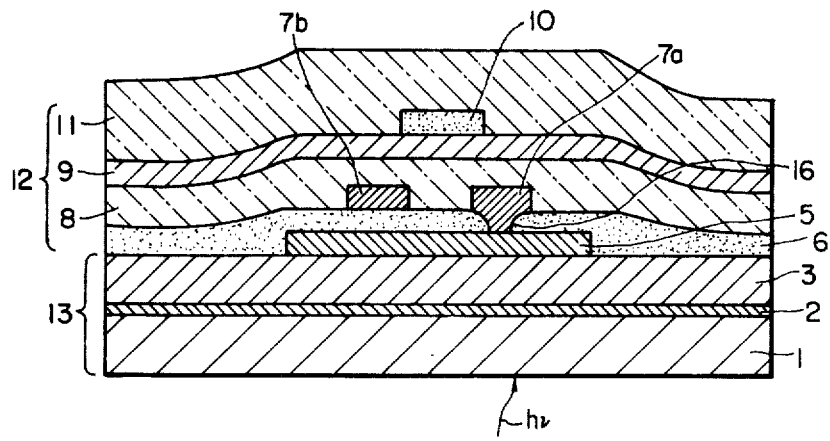
FIG. 1 is a side cross sectional view of one preferred embodiment of the thin film image pickup element constructed according to this invention.
Figure 2:
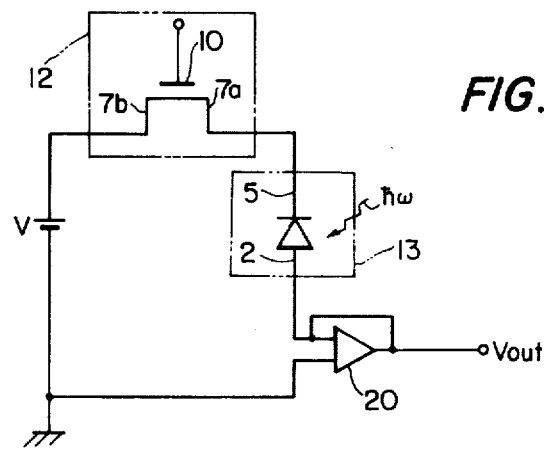
FIG. 2 is an explanatory view of the reading circuit for the thin film image pickup element shown in FIG. 1.

Reference is made to the drawings, particularly to FIGS. 1 and 2 showing one preferred embodiment of the thin film image pickup element and its reading circuit constructed according to this invention, wherein like reference numerals designate the same parts in the following views.

In FIGS. 1 and 2, the thin film image pickup element 10 of this invention comprises a transparent substrate 1 made of glass or the like. The entire upper surface of the substrate 1 is covered with a transparent electrode 2. A first semiconductor layer 3 of, for example, an amorphous silicon or the like is then deposited over the entire surface of the transparent electrode 2. A portion of the first semiconductor layer 3 is covered with an opaque electrode 5 of, for example, platinum or the like formed in the size of a picture element unit of an original document on the surface thereof.

A first insulator layer 6 is subsequently covered on the upper surfaces of the electrode 5 and the layer 3, and a portion of the layer 6 is opened with one contact hole 16 to communicate with the upper surface of the electrode 5.

It should be noted that a Schottky junction diode is formed at the junction between the layer 3 and the electrode 5.

A photoelectric converter 13 is formed by the substrate 1, the electrode 2, the layer 3, and electrode 5 and the layer 6.

A first upper electrode 7a is then connected through the contact hole 16 in contact with the upper surface of the layer 6 to the electrode 5, and a second upper electrode 7b is so formed in contact with the upper surface of the layer 6 to confront the electrode 7a. A second semiconductor layer 8 is then deposited over the entire surfaces of the electrodes 7a and 7b as well as the layer 6.

A second insulator layer 9 is then covered on the entire upper surface of the layer 8. A portion of the layer 9 is covered with a gate electrode 10 formed for controlling the conduction of a current channel from the electrode 7b to the electrode 7a. Subsequently, the entire surface of both the layer 9 and the electrode 10 is covered with a passivation film 11.

Reference numeral 20 shown in FIG. 2 designates an amplifier. An FET transistor switching element 12 is formed by the electrodes 7a, 7b, the layer 8, the layer 9, the electrode 10 and the film 11.

The operation of reading an original document with the thin film image pickup element thus fabricated will now be described.

A voltage is applied to the gate electrode 10, and the switching element 12 is closed. Thus, a capacitor formed between the transparent electrode 2 and the opaque electrode 5 is charged. Then, the voltage applied to the gate electrode 10 is dropped to zero, and the switching element 12 is resultantly opened. Thereafter, a light reflected from the original for reading thereof is incident upon the substrate 1, and consequently discharges the charge of the capacitor formed between the electrodes 2 and 5 by an amount corresponding to the quantity of the light.

When a voltage is again applied to the gate electrode 10 and the switching element 12 is thus closed, a current corresponding to the amount of charge thus discharged flows from the electrode 7b to the electrode 7a. This current is converted into an electric signal, and is then amplified by the amplifier 20 to thereby read the original.

It should be understood that due to the construction of the thin film image pickup element of this embodiment, the reading light from the original is interrupted by the opaque electrode 5 and consequently does not influence the conductivity of the layer 8 between the electrodes 7a and 7b.

It should also be noted that although this embodiment has been described as employing a Schottky junction diode, the invention is not to be so limited, but may also use a p-n junction or a p-i-n junction diode, as will be described later in greater detail with reference to FIG. 4.

Figure 3:
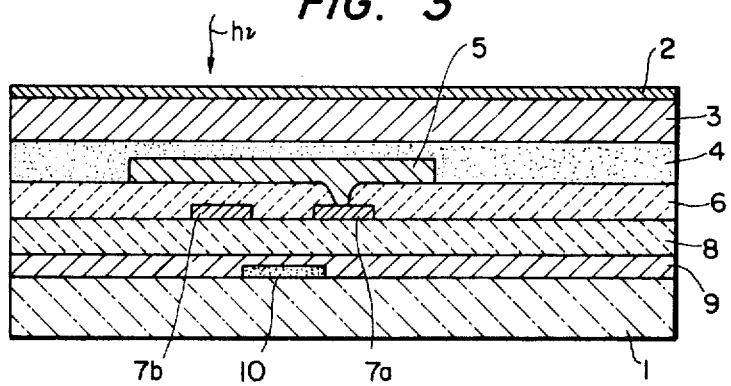
FIG. 3 is a view similar to FIG. 1 but showing another preferred embodiment of this invention.

FIG. 3 shows another preferred embodiment of the thin film pickup element of this invention in cross section. In FIG. 3, the same reference numerals as those shown in FIGS. 1 and 2 designate the same parts and components. This embodiment is constructed such that the components used in the first embodiment are disposed in the reverse direction. The layer 3 in FIG. 3 is an n-type semiconductor while the layer 4 is a p-type semiconductor, so that a p-n junction rather than a Schottky junction is utilized, but the operation is the same. Consequently, this embodiment should obviously operate and effect the same advantages as in the first embodiment shown in FIGS. 1 and 2.

It should be also understood however, that since this embodiment is fabricated reversely, the substrate 1 may be of an opaque material such as, for instance, non-polished glass or ceramics. In this case, the surface of the ceramic material is not formed in a perfectly smooth plane, but is normally provided with a shape which is microscopically uneven. If the semiconductor layer is formed directly on the ceramic surface, there is a potential problem of the semiconductor becoming crystallized. However, when the ceramic surface is annealed, this problem can be substantially eliminated.

FIGS. 4(a) through 4(e) show in cross section the steps of fabricating yet another preferred embodiment of the thin film image pickup element constructed according to this invention. In FIGS. 4(a) through 4(e), the same reference numerals as those shown in FIGS. 1 and 2 designate the same or equivalent parts and components. Reference numeral 23 illustrates an n-type semiconductor layer, and 24 is a p-type semiconductor layer.

Figure 4A:
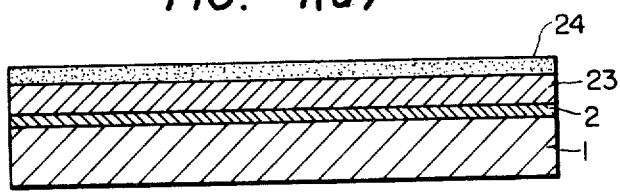
FIGS. 4(a) through 4(e) are side cross sectional views showing the steps of fabricating yet another preferred embodiment of the thin film image pickup element of this invention.

In FIG. 4(a), glass No. 7059 made by Corning Glass Co. having a thickness of 0.8 mm is employed as a transparent substrate 1. The entire surface of the substrate 1 is covered, by sputtering, with a transparent electrode 2 in a thickness of approximately 1,000 angstroms of a silicon dioxide layer. The electrode layer 2 is then sputtered with a $1.5 \times 10^{-4}$ Torr partial pressure of oxygen ($O_2$), $4 \times 10^{-3}$ Torr partial pressure of argon (Ar) and approximately 180 watts of electric power.

Subsequently, the n-type semiconductor layer 23 is formed of a mixture of 0.1 to 1% by weight of phosphorus trihydrogen ($PH_3$) with the rest silicon tetrahydrogen ($SiH_4$) on the entire surface of the transparent electrode 2. In this case, the layer 23 is formed with an n-type amorphous silicon by a glow discharging process in ohmic contact with the electrode 2. The glow discharging apparatus is of the capacity coupling type which has a frequency of 13.56 MHz, 1 to 5 watts of power, and approximately 250° C. of substrate temperature, all of which are regulated.

Then, the p-type semiconductor layer 24 is formed of a mixture of 0.1 to 1% by weight of diboron hexahydrogen ($B_2H_6$) and silicon tetrahydrogen ($SiH_4$) on the entire surface of the layer 23.

Figure 4B:
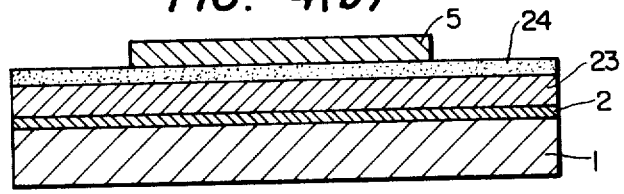

Subsequently, as shown in FIG. 4(b), a portion of the layer 24 is covered with the opaque electrode 5 in ohmic contact with the layer 24 for interrupting the reading light from the original. The electrode 5 preferably is of aluminum. The electrode 5 should typically be deposited in a thickness of approximately 4,000 angstroms. Thereafter, it is formed in a prescribed sensor pattern by photolithography.

Figure 4C:
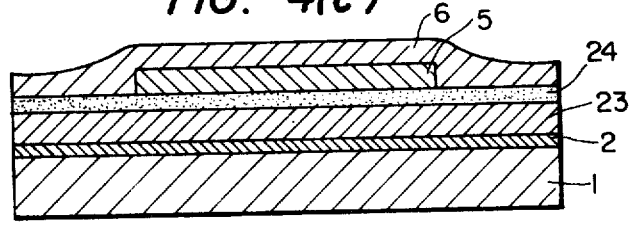

In FIG. 4(c), the insulating film 6 of silicon nitride (SiNx) is then covered on the opaque electrode 6 by a plasma CVC (chemical vapor deposition) process. In this case, the mixture ratio of the silicon tetrahydrogen ($SiH_4$) and the nitrogen trihydrogen ($NH_3$) is approximately 0.17% by weight of the latter, and the density of the silicon tetrahydrogen is 5%.

Figure 4D:
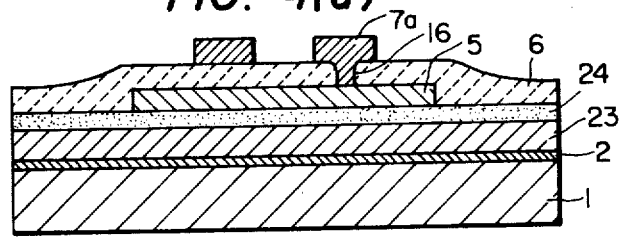

As shown in FIG. 4(d), a contact hole 16 is opened in the film 6 by photolithography, and the first and second upper electrodes 7a and 7b are subsequently formed thereon as was described before.

Figure 4E:
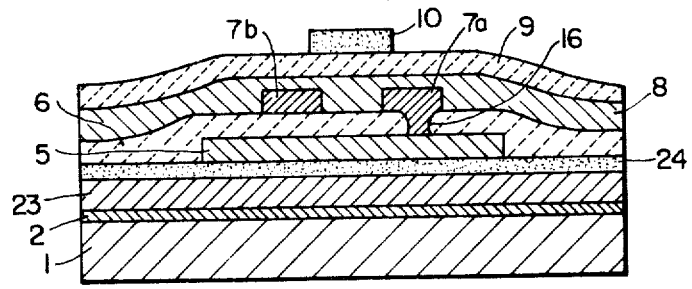

As further shown in FIG. 4(e), the second semiconductor layer 8 of amorphous silicon, cadmium sulfide (CdS), cadmium selenide (CdSe), or the like, is covered on the first and second electrodes 7a and 7b by a glow discharging process. Then, the second insulator layer 9 of silicon nitride ($Si_3N_4$), silicon dioxide ($SiO_2$), or the like, is covered on the entire surface of the layer 8.

Further, a portion of the layer 9 is covered with the gate electrode 10 formed for controlling the conduction of the current channel from the upper electrode 7b to the upper electrode 7a. It should be noted that even if the p-n junction diode is employed as in this embodiment, the original can be read in the same manner as the first and second embodiments as was already described before.

It should also be understood from the foregoing description that since the thin film image pickup element of this invention is thus fabricated in the steps of superimposing the photoelectric converter on the substrate of glass or ceramic and further forming the switching element thereon in thin film and the multilayer wires thereon, the size of each pickup element may be very small so that a two-dimensional original may be easily read.

It should also be appreciated that since this thin film image pickup element of this invention can employ opaque non-polish glass, ceramic, etc. as the substrate, its operating efficiency can be significantly improved.

Figure 5:
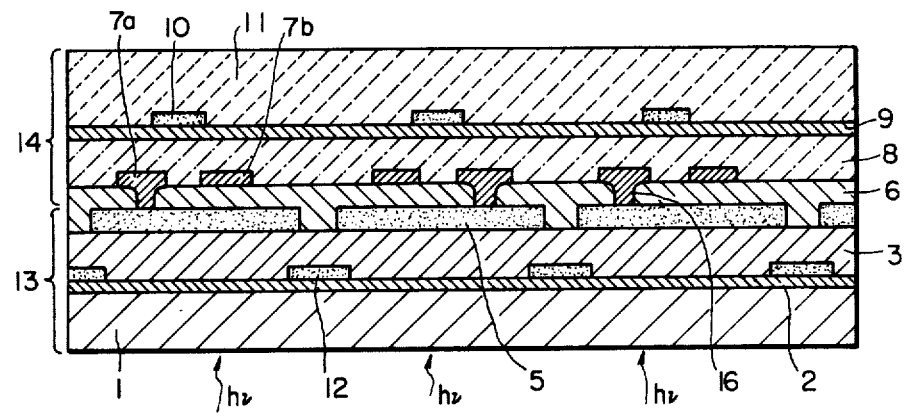
FIG. 5 is a side cross sectional view of a further preferred embodiment of the two-dimensional thin film image pickup device constructed according to this invention.
Figure 6:
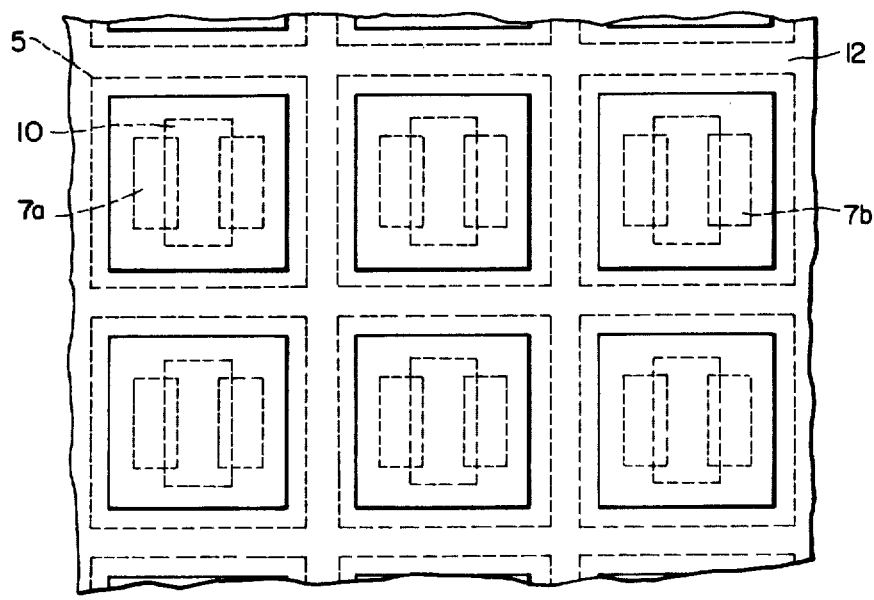
FIG. 6 is a bottom view of the image pickup device shown in FIG. 5.

FIGS. 5 and 6 show in cross section and in a bottom view still another preferred embodiment of the two-dimensional thin film image pickup device constructed according to this invention. In FIGS. 5 and 6, the entire upper surface of a transparent substrate 1 is covered with a transparent electrode 2. Portions of the electrode layer 2 are formed with a number of opaque films 12 arranged in a lattice having a number of openings, the films 12 being arrayed laterally and longitudinally in contact with the electrode 2 in the form of a matrix.

A first semiconductor layer 3 is then deposited over the entire surface of the electrode 2 and the film 12. Subsequently, portions of the layer 3 are covered with a number of opaque electrodes 5 each the size of a picture element unit and so disposed as to block the openings of the film 12. It should be noted that a Schottky junction is formed at the junction between the layer 3 and the electrode 5.

A first insulator layer 6 is subsequently covered on the entire surface of the electrodes 5 and the layer 3, and portions of the layer 6 are opened with contact holes 16 each penetrating the upper surface of a respective one of the electrodes 5.

First upper electrodes 7a in contact with the upper surface of the layer 6 are then connected through the contact holes 16 to the electrode 5, and second upper electrodes 7b are formed in contact with the upper surface of the layer 6 to confront the electrodes 7a. A second semiconductor layer 8 is then deposited over the entire surfaces of the electrodes 7a and 7b as well as the layer 6 to form current channels between the respective electrodes 7a and 7b.

A second insulator layer 9 is then covered on the entire upper surface of the layer 8. Portions of the layer 9 are covered with a number of gate electrodes 10 formed for controlling the conduction of the current channels from the respective electrodes 7b to the respective electrodes 7a. Subsequently, the entire surface of both the layer 9 and the electrodes 10 is covered with a passivation film 11.

A plurality of photoelectric converters 13 are thus formed with the substrate 1, the electrode 2, the layer 3 and an electrode 5, and respective switching elements 14 are each formed with the layer 6, a pair of electrodes 7a and 7b, the layer 8, the layer 9 and an electrode 10.

Reading of an original document will now be described with the two-dimensional thin film image pickup device thus fabricated.

A voltage is applied to the gate electrodes 10, and the switching elements 14 are closed. Thus, capacitors effectively formed between the respective transparent electrodes 2 and the respective opaque electrodes 5 are charged. Then, the voltage applied to the gate electrodes 10 is dropped to zero, causing the switching elements 14 to be opened. Thereafter, a reading light from the original is incident upon the substrate 1 from the substrate side, and consequently discharges the charges of the capacitors formed between the electrodes 2 and 5 in an amount corresponding to the quantity of the light.

When a voltage is again applied to the gate electrodes 10 and the switching elements 14 are thus closed, currents corresponding to the amount of charge thus discharged flow from the respective electrodes 7b to the respective electrodes 7a. These currents are converted into electric signals, thereby reading the original.

The layer 3 preferably employs amorphous silicon, which will be hereinafter referred to as an "a-Si", because of the integration of the photoelectric converters 13 and the switching elements 14 and in view of the desirability of heat resistance and electric stability in the steps of fabricating the opaque electrodes 5 by photolithography.

It should be understood that, since the electrodes 5 on the side of photoelectric converters 13 adjacent the switching elements 14 are opaque, the reading light from the original does not adversely effect the conductivity of the layer 8 in the switching elements 14.

It should also be noted that although the opaque films 12 are formed on the transparent electrode 2 in this embodiment, this insulating opaque film may also be buried in the electrode 5.

It should be evident that this embodiment responds to reading light from the original which is incident upon the substrate 1; however, the substrate 1 may instead be formed at the opposite side. In this case the substrate may employ opaque material such as, for example, ceramics, as was already described with reference to the embodiment shown in FIG. 3 which is a similar modification of the embodiment of FIG. 1.

It should be noted that although this embodiment employs a Schottky junction diode, the invention is not to be so limited, but may instead use a p-n junction or a p-i-n junction diode, as will be described later in greater detial with reference to FIG. 9.

A thin film transistor is generally characterized by small mobility as compared with a crystalline semiconductor. Accordingly, in order to supplement this, it is necessary to provide sufficiently large W/L ratio, where W represents a channel width, and L represents a channel length. According to this invention, the entire back surface of the image pickup element opposite the reading light receiving side may be used as a wiring region, and the aforementioned W/L requirement can be satisfied by forming the transistor across a plurality of image pickup elements with, for instance, an FET.

Figure 7:
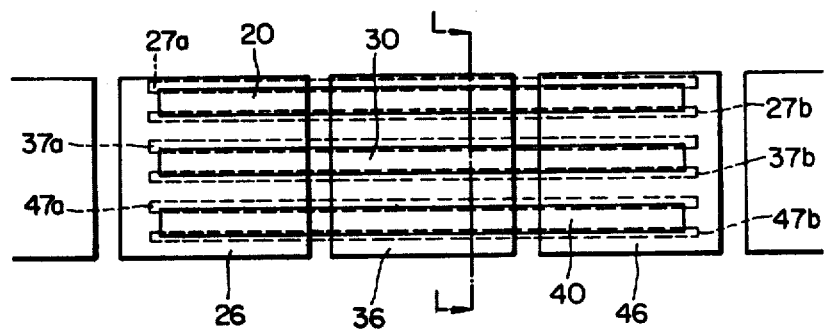
FIG. 7 is a plan view of still another preferred embodiment of this invention.
Figure 8:
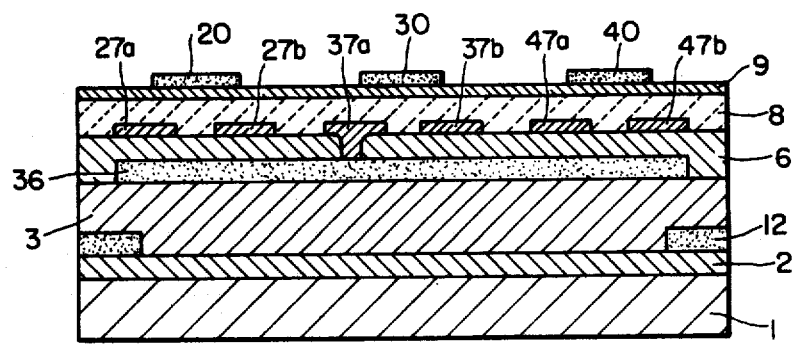
FIG. 8 is a view similar to FIG. 5 but showing still another preferred embodiment of this invention taken along the line L—L in FIG. 7.

FIG. 7 shows a plan view of still another preferred embodiment of the two-dimensional thin film image pickup device having increased W/L ratio, and FIG. 8 shows the side cross section of the image pickup device taken along the line L—L in FIG. 7. In FIGS. 7 and 8, like reference numerals designate the same or equivalent parts and components as those shown in FIG. 5.

Reference numerals 20, 30 and 40 illustrate gate electrodes, 26, 36 and 46 indicate opaque electrodes contained in the respective image pickup elements, 27a, 37a and 47a are first upper electrodes which are connected through contact holes to respective opaque electrodes 26, 36 and 46, and 27b, 37b and 47b are second upper electrodes. I.e., the electrodes 27, 37 and 47 all span three pickup elements, but electrodes 27a, 37a and 47a are each connected through a hole to only one of the three opaque electrodes which it crosses. For example, FIG. 8 shows that only electrode 37a is in contact with the electrode 36.

In this embodiment shown in FIG. 7, the width between the first electrodes 27a, 37a, 47a and the second electrodes 27b, 37b, 47b, and between the gate electrodes 20, 30, 40, i.e., the widths W of the effective current channels between the first electrode 27a and the second electrode 27b, between the first electrode 37a and the second electrode 37b, and between the first electrode 47a and the second electrode 47b may correspond substantially to the composite lateral width of the opaque electrdoes 26, 37 and 46. On the other hand, the channel length L may be reduced as shown in FIG. 8. Accordingly, the value of the ratio W/L may be increased, thereby increasing the mobility.

In this case there is a gap between the image pickup elements, i.e. between each of the electrodes 26, 36 and 46 which leads to concern that light may be permitted to adversely affect the conductivity of that portion of the exposed second semiconductor layer in which the current channels are formed, but since the opaque films 12 are formed the same manner as in FIG. 5, such adverse effect can be eliminated.

FIGS. 9(a) through 9(e) show in cross section the steps of fabricating still another preferred embodiment of the two-dimensional thin film image pickup device constructed according to this invention. In FIGS. 9(a) through 9(e), like reference numerals as those shown in FIG. 5 designate the same or equivalent parts and components. Reference numeral 23 designates an n-type semiconductor layer, and 24 is a p-type semiconductor layer.

Figure 9A:
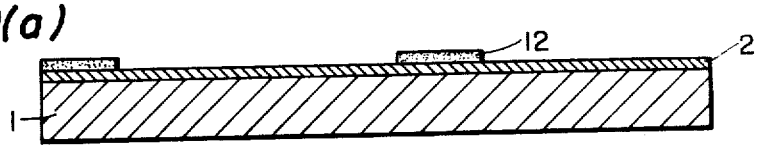
FIGS. 9(a) through 9(e) are side cross sectional views showing the steps of fabricating still another preferred embodiment of the two-dimensional thin film image pickup device of this invention.

In FIG. 9(a), glass No. 7059 made by Corning Glass Co. having a thickness of 0.8 mm is employed as a transparent substrate 1 in the same manner as the previous embodiment shown in FIGS. 4(a) through 4(e), and the entire surface of the substrate 1 is covered with the transparent electrode 2 in a thickness of approximately 1,000 angstroms of a silicon dioxide layer by sputtering.

Then, in order to interrupt the light among a plurality of image pickup elements arrayed in matrix shape, opaque films 12 are deposited or adhered by sputtering onto portions of the electrode 2. The film 12 may employ either conductive or nonconductive material. In this embodiment, chromium is deposited by an electron beam deposition in a thickness of 400 to 1,000 angstroms and is patterned as desired by a photolithography.

Figure 9B:
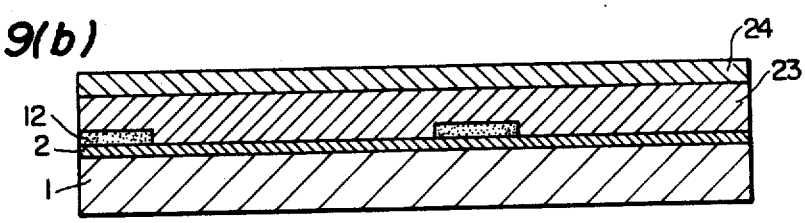

Subsequently, as shown in FIG. 9(b), the n-type semiconductor layer 23 is formed of a mixture of 0.1 to 1% by weight of phosphorus trihydrogen ($PH_3$) and the rest silicon tetrahydrogen ($SiH_4$) on the entire surface of the transparent electrode 2 and the opaque films 12. In this case, the layer 23 is formed with n-type a-Si by a glow discharging process in ohmic contact with the transparent electrode 2.

Further, the p-type semiconductor layer 24 is then formed of a mixture of 0.1 to 1% by weight of diboron hexahydrogen ($B_2H_6$) and the rest silicon tetrahydrogen ($SiH_4$) on the entire surface of the layer 23 by a glow discharging process.

The glow discharging apparatus may preferably employ a capacity coupling type plasma CVD device which has a frequency of 13.56 MHz, 1 to 5 watts of power, and 230° to 300° C. of substrate temperature.

Figure 9C:
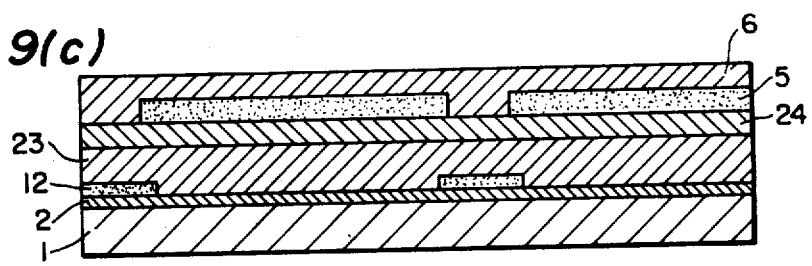

Then, as shown in FIG. 9(c), portions of the layer 24 are covered with opaque electrodes 5 in ohmic contact with the layer 24 for interrupting the reading light from the original. The electrodes 5 are preferably of aluminum. The electrodes 5 may typically be deposited in a thickness of approximately 4,000 angstroms, and thereafter formed in a prescribed matrix shape by a photolithography.

Subsequently, the insulating film 6 is formed over the opaque electrodes 5 by a plasma CVD process. In this case, the mixture ratio of the silicon tetrahydrogen ($SiH_4$) and the nitrogen trihydrogen ($NH_3$) is approximately 0.17% by weight, and the density of the silicon tetrahydrogen is 5%.

Figure 9D:
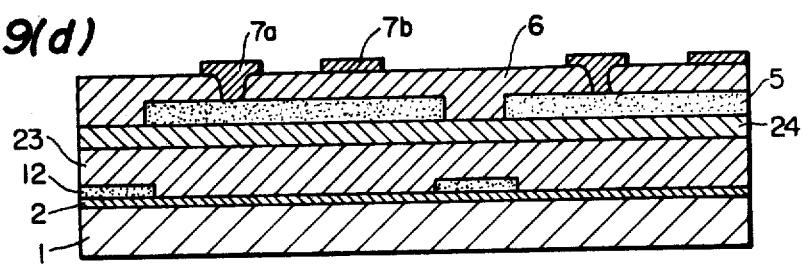

Further, as shown in FIG. 9(d), contact holes 16 are opened in the film 6, and the first and the second upper electrodes 7a and 7b are subsequently formed thereon as was described before.

Figure 9E:
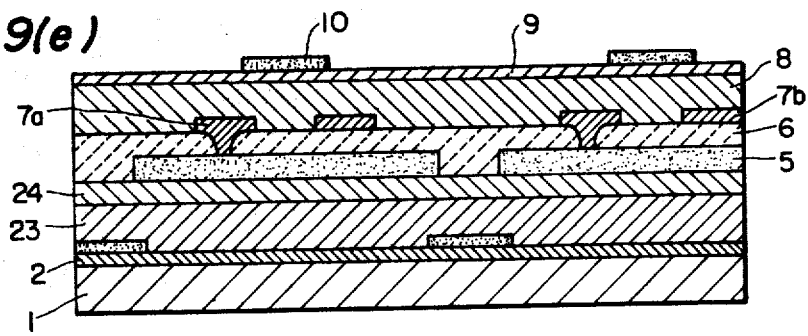

Thereafter as shown in FIG. 9(e), the second semiconductor layer 8 (a-Si) is formed over the first and second electrodes 7a and 7b by a glow discharging process. Then, the second insulator layer 9 of silicon nitride ($Si_3N_4$) is formed over the entire surface of the layer 8. Finally, portions of the layer 9 are covered with the gate electrodes 10 formed for controlling the conduction of the current channels from the upper electrodes 7b to the upper electrodes 7a.

It should be noted that, although this embodiment employs as the gate electrodes a thickness of approximately 4,000 angstroms of aluminum deposited by an electron beam deposition, it may also selectively etch n+-type. It should also be noted that, even if a p-n junction diode is employed as in this embodiment, the original can be read in the same manner as the embodiment shown in FIG. 5.

Figure 10:
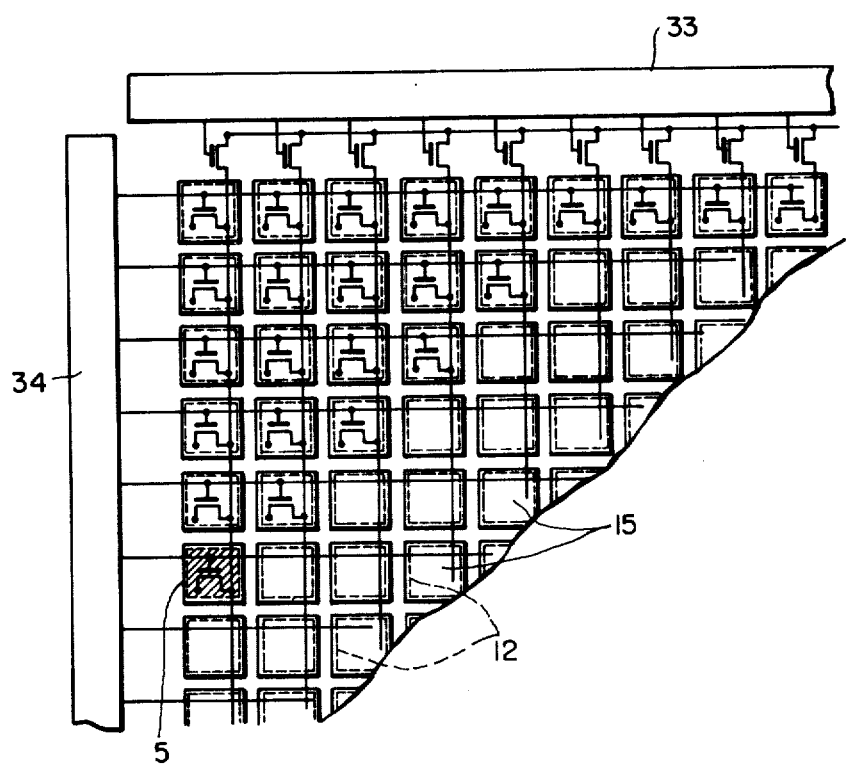
FIG. 10 is a schematic model view of still another preferred embodiment of the two-dimensional image pickup device of this invention where a number of image pickup elements are arrayed in a matrix shape.

FIG. 10 shows a two-dimensional thin film image pickup device in which a number of image pickup elements are arrayed in a matrix. In FIG. 10, the same reference numerals as those in FIG. 5 designate the same or equivalent parts. Reference numeral 15 illustrates a reading light incident units (each including an opaque electrode 5 confronting an opening of the opaque films 12), 33 is an X-axis shift register, and 34 is a Y-axis shift register.

Since the two-dimensional thin film image pickup device necessitates two-layer wirings in both X-axis and Y-axis directions, there are provided X-axis and Y-axis shift registers at both sides of the matrix of image pickup elements and wired as shown by a photolithography.

It should be understood from the foregoing description that, since the two-dimensional thin film image pickup device of this invention is thus fabricated in the steps of providing the phtotoeletric converters and the switching elements in thin film on a substrate of glass or ceramics with multilayer wires, the size of the pickup device may be reduced and the device may consequently read the two-dimensional original of large area.

It should also be appreciated that since the image pickup device of this invention provides opaque films among the opaque electrodes or on the transparent electrode among the adjacent image pickup elements, the incident light does not adversely effect the conductivity of the semiconductor in which the current channels are formed.

It should also be noted that since the image pickup device of this invention can read a large area two-dimensional original, it may be used instead of the photosensitive material presently used for electrophotographic machines. For example, when signals representing the image of an original exposed onto the two-dimensional thin film image pickup device by a flash light are inputted to an output printer such as, for instance, an ink jet printer, multi-stylus printer, or the like, as time series electric signals, the post-processing of the image signals can be greatly simplified.

What is claimed is:

1. A thin film image pickup element comprising:
   a transparent electrode,
   at least a first semiconductor layer formed on a surface of said transparent electrode,
   an opaque electrode formed on at least a part of said at least first semiconductor layer,
   a first insulator covering said first semiconductor layer and said opaque electrode and having a contact hole reaching at least a part of said opaque electrode,
   a first switch electrode connected through said contact hole to said opaque electrode,
   a second switch electrode adjacent but not in contact with said first switch electrode,
   a further semiconductor layer covering said first and second switch electrodes and said first insulator layer to form a current channel between said first and second switch electrodes,
   a second insulator layer covering said first semiconductor layer, and
   a gate electrode disposed in contact with said second insulator layer so as to face said current channel.

2. The thin film image pickup element as defined in claim 1, wherein said first semiconductor layer is formed of amorphous silicon.

3. The thin film image pickup element as defined in claim 1, wherein said opaque electrode is formed of platinum in a size corresponding to a picture element unit of an original from which an image is to be picked up.

4. The thin film image pickup element as defined in claim 1, wherein a Schottky junction diode is formed at the junction between said first semiconductor layer and said opaque electrode.

5. The pickup element as defined in claim 1, wherein said transparent electrode, said first semiconductor layer, said opaque electrode and said first insulator layer together form a photoelectric converter.

6. The pickup element as defined in claim 1, further comprising a passivation film covering said gate electrode, wherein said first and second upper electrodes, said further semiconductor layer, said gate electrode and said passivation film covering on said gate electrode together form an FET transistor switching element.

7. The pickup element as defined in claim 1, further comprising a substrate of non-polished glass or ceramics formed adjacent said transparent electrode.

8. The pickup element as defined in claim 7, wherein a surface of said substrate contacting said transparent electrode is annealed at a predetermined temperature.

9. The pickup element as defined in claim 1, wherein said at least first semiconductor layer comprises a first semiconductor layer of one conductivity type and a second semiconductor layer of an opposite conductivity type.

10. The pickup element as defined in claim 9, wherein said first semiconductor layer is n-type and is in contact with said transparent electrode and said second semiconductor layer is p-type and is disposed between said first semiconductor layer and said opaque electrode.

11. A two-dimensional thin film image pickup device comprising:
    a transparent electrode;
    an opaque film formed on portions of said transparent electrode for interrupting light incident through said transparent electrode, said opaque film having a plurality of openings therein;
    at least a first semiconductor layer formed over said transparent electrode and said film;
    a plurality of opaque electrodes formed on said at least first semiconductor layer at predetermined intervals therebetween;
    a first insulator layer covering said at least first semiconductor layer and said opaque electrodes and having contact holes reaching the surface of said opaque electrodes;
    a plurality of first switch electrodes connected through the contact holes to said opaque electrodes;
    a plurality of second switch electrodes formed in contact with said first insulator layer adjacent but not in contact with said first switch electrodes;
    a further semiconductor layer covering said first and second switch electrodes and said first insulator layer to form current channels between said first and second switch electrodes;
    a second insulator layer covering said further semiconductor layer; and
    a plurality of gate electrodes disposed in contact with said second insulator layer and facing respective current channels for controlling the conduction of respective current channels between respective pairs of said first and second switch electrodes.

12. The two-dimensional thin film image pickup device as defined in claim 11, wherein said opaque electrodes are so disposed as to block light incident through said opaque film openings.

13. The image pickup device as defined in claim 11, wherein a Schottky junction is formed at the junction between said at least first semiconductor layer and said opaque electrode.

14. The pickup device as defined in claim 11, wherein said transparent electrode, said at least first semiconductor layer, each of said opaque electrodes and said first insulator together form a photoelectric converter.

15. The pickup device as defined in claim 11, wherein each of said second switch electrodes is adjacent but not in contact with a respective one of said first switch electrodes to form a pair of first and second switch electrodes, and wherein said first insulator layer, each said pair of said first and second switch electrodes, said further semiconductor layer, said second insulator layer, and respective ones of said gate electrodes together form a switching element.

16. The pickup device as defined in claim 11, said pickup device having a back surface, said pickup device including wiring regions formed on said back surface of said image pickup device.

17. The pickup device as defined in claim 11, wherein a plurality of said first switch electrodes, a plurality of said second switch electrodes and a plurality of said gate electrodes overlie each opaque electrode.

18. The pickup device as defined in claim 11, wherein said at least first semiconductor layer comprises a first layer of one conductivity type and a second layer of an opposite conductivity type disposed between said first layer and opaque electrodes.

19. The pickup device as defined in claim 11, wherein said opaque film comprises a plurality of films arranged in a matrix.

20. The pickup device as claimed in claim 11, further comprising a plurality of X-axis wires each connected to a plurality of different second switch electrodes, an X-axis shift register for detecting signals in each of said X-axis wires, a plurality of Y-axis wires each connected to a plurality of different gate electrodes, and a Y-axis shift register for providing gate signals to said Y-axis wires.

21. A two-dimensional thin film image pickup device comprising:
 a transparent electrode;
 at least a first semiconductor layer formed over said transparent electrode;
 a plurality of opaque electrodes formed on said at least first semiconductor layer at predetermined intervals therebetween;
 a first insulator layer covering said at least first semiconductor layer and said opaque electrodes and having contact holes reaching the surface of said opaque electrodes;
 a plurality of first switch electrodes connected through the contact holes to said opaque electrodes;
 a plurality of second switch electrodes formed in contact with said first insulator layer adjacent but not in contact with said first switch electrodes;
 a further semiconductor layer covering said first and second switch electrodes and said first insulator layer to form current channels between said first and second switch electrodes;
 light-blocking means for preventing light from reaching said further semiconductor layer through said intervals between opaque electrodes;
 a second insulator layer covering said further semiconductor layer; and
 a plurality of gate electrodes disposed in contact with said second insulator layer and facing respective current channels for controlling the conduction of respective current channels between respective pairs of said first and second switch electrodes.

* * * * *